US011290052B2

(12) United States Patent
Williams

(10) Patent No.: US 11,290,052 B2
(45) Date of Patent: Mar. 29, 2022

(54) SOLAR ULTRA-LIGHT OPERATED BATTERY AND THE METHOD THEREOF

(71) Applicant: Mary Ja Ne' Williams, Kemah, TX (US)

(72) Inventor: Mary Ja Ne' Williams, Kemah, TX (US)

(*) Notice: Subject to any disclaimer, the term of this patent is extended or adjusted under 35 U.S.C. 154(b) by 0 days.

(21) Appl. No.: 16/174,048

(22) Filed: Oct. 29, 2018

(65) Prior Publication Data

US 2019/0149084 A1 May 16, 2019

Related U.S. Application Data

(60) Provisional application No. 62/577,989, filed on Oct. 27, 2017.

(51) Int. Cl.
| H02S 10/40 | (2014.01) |
| H02S 30/00 | (2014.01) |
| H02S 40/30 | (2014.01) |
| H02S 40/38 | (2014.01) |
| H02S 40/34 | (2014.01) |
| H02S 40/22 | (2014.01) |
| H01L 31/056 | (2014.01) |
| H01L 31/048 | (2014.01) |
| H02S 20/30 | (2014.01) |
| H01R 33/94 | (2006.01) |

(52) U.S. Cl.
CPC ............ *H02S 10/40* (2014.12); *H01L 31/048* (2013.01); *H01L 31/056* (2014.12); *H02S 20/30* (2014.12); *H02S 30/00* (2013.01); *H02S 40/22* (2014.12); *H02S 40/30* (2014.12); *H02S 40/34* (2014.12); *H02S 40/38* (2014.12); *H01R 33/94* (2013.01)

(58) Field of Classification Search
CPC ............................... H01L 31/056; H02S 20/30
USPC .......................... 136/251, 246, 206; 320/101
See application file for complete search history.

(56) References Cited

U.S. PATENT DOCUMENTS

| 4,740,431 | A |  | 4/1988 | Little |  |
| 5,936,380 | A |  | 8/1999 | Parrish |  |
| 6,977,479 | B2 |  | 12/2005 | Po-Jung |  |
| 8,432,124 | B2 | * | 4/2013 | Foster | ................... A45C 15/00 |
|  |  |  |  |  | 320/101 |
| 8,531,152 | B2 |  | 9/2013 | Blau |  |
| 9,345,178 | B2 | * | 5/2016 | Davis | ................... H05K 9/0007 |
| 9,680,189 | B2 | * | 6/2017 | Metcalf | ............... H01M 10/465 |
| 2002/0088486 | A1 |  | 7/2002 | Chenx |  |
| 2005/0282591 | A1 |  | 12/2005 | Shaff |  |
| 2006/0238163 | A1 |  | 10/2006 | Chen |  |
| 2008/0143291 | A1 |  | 6/2008 | Lin |  |
| 2008/0315828 | A1 | * | 12/2008 | Lu | ........................... H02J 7/342 |
|  |  |  |  |  | 320/101 |

(Continued)

*Primary Examiner* — Nina Bhat

(57) ABSTRACT

A mobile battery pack includes a housing. The housing is defined by an upper surface and a lower surface the upper surface of the housing includes a transparent portion. A number of layers are placed between the upper surface and the tower surface. The layers include at least one bifacial solar panel placed underneath the transparent portion of the upper surface and at least one reflective layer placed below the bifacial solar panel. The reflective layer includes at least one light emitting diode. The reflective light emitting diode activates the solar array producing solar energy. A rechargeable battery is connected with the bifacial solar panel and means of transmitting solar energy to the rechargeable battery.

5 Claims, 7 Drawing Sheets

(56) References Cited

U.S. PATENT DOCUMENTS

Figure 1:
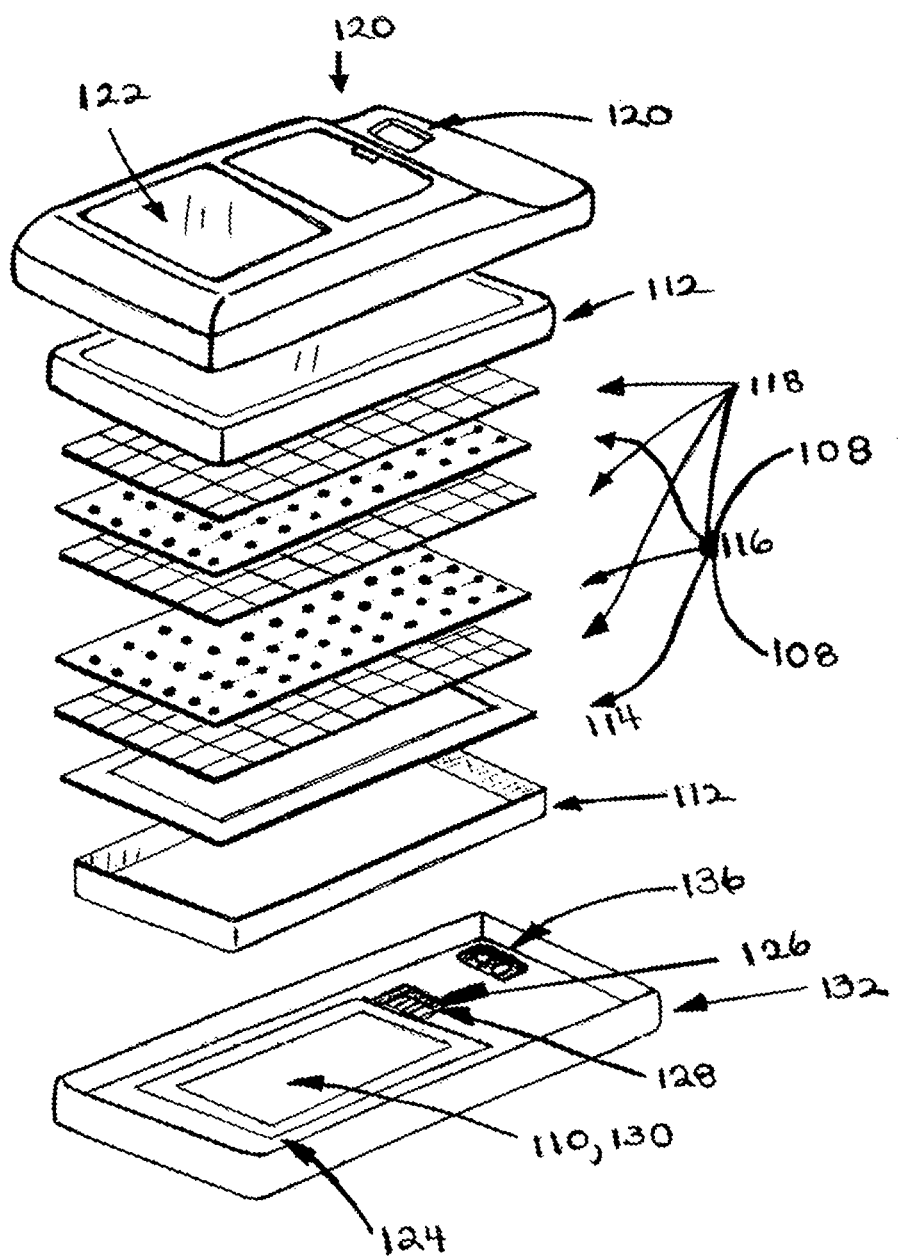

| | | |
|---|---|---|
| 2009/0160398 A1 | 6/2009 | Chen |
| 2010/0001681 A1 | 1/2010 | Zhang |
| 2010/0013428 A1* | 1/2010 | Shin ................. H02J 7/35 320/101 |
| 2010/0167797 A1 | 7/2010 | Morichi |
| 2010/0231162 A1 | 9/2010 | Gibson |
| 2011/0199040 A1* | 8/2011 | English ............. H02J 7/0071 320/101 |
| 2012/0042996 A1* | 2/2012 | Glynn ................ A45C 15/00 150/106 |
| 2013/0206470 A1* | 8/2013 | Davis ................ H01R 13/72 174/382 |
| 2013/0220401 A1* | 8/2013 | Scheulov ........... H01L 31/0525 136/246 |
| 2013/0305528 A1* | 11/2013 | Anderson ............. H02S 20/30 29/825 |
| 2014/0116495 A1* | 5/2014 | Kim ................... H02S 40/22 136/246 |
| 2014/0261636 A1* | 9/2014 | Anderson ........... H01L 31/0201 136/251 |
| 2015/0270410 A1* | 9/2015 | Heng ................ H01L 31/0504 136/251 |
| 2015/0311747 A1* | 10/2015 | Chu ..................... H02J 7/35 307/18 |
| 2016/0141898 A1 | 5/2016 | Ricot |
| 2016/0233824 A1* | 8/2016 | Ravi ................. H01L 31/0504 |
| 2017/0162735 A1* | 6/2017 | Hsu ................ H01L 31/022433 |

* cited by examiner

FIG 3.
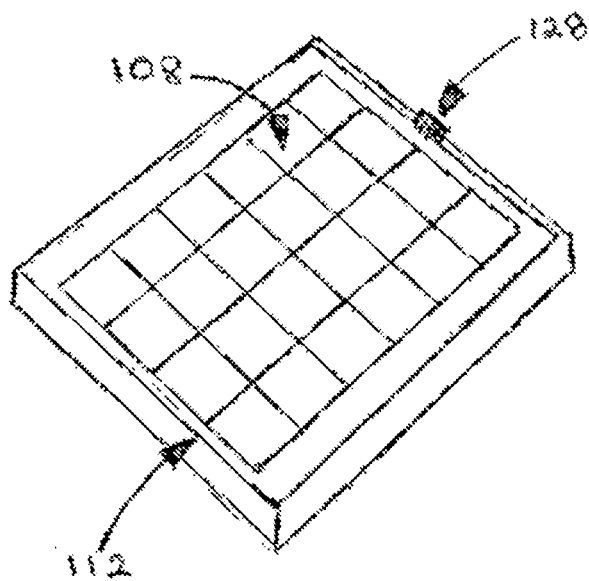
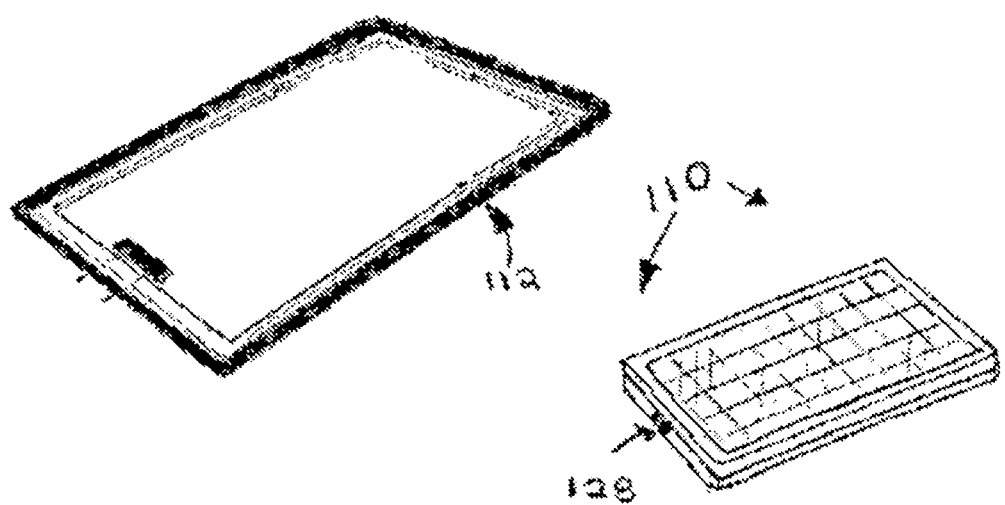

SOLAR ULTRA-LIGHT OPERATED BATTERY AND THE METHOD THEREOF

CROSS-REFERENCE TO RELATED APPLICATION

This application claims the benefit of Provisional Patent Application No. 62/577,989, filed on 27 Oct. 2017, in the United States Patent & Trademark Office, the disclosure of which is incorporated herein by reference.

BACKGROUND OF THE INVENTION

1. Field of the Invention

The present invention relates to a solar battery pack, and more particular, the method of operations thereof for mobile phones and other handheld electronic devices.

Mobile handheld electronic devices often have a more limited battery life than their owners would prefer. Often times an individual spends a great amount of time on their phones indoors and outdoors, which causes their phone batteries to drain.

They are unable to charge the phone battery and or other handheld devices without the need of using a separate charging device. Handheld electronic devices are typically charged with a wired charging device. Most charging devices require an electrical outlet. If an outlet is unavailable, people may be unable to charge their phones or other devices in order to view text messages, emails, make phone calls, and more. Due to excessive usage of their phones talk and standby time usage, batteries drain and lose their charge. Especially now that families uses their mobile phones for home and business, landlines are not really useful anymore. Therefore, in view of the foregoing disadvantages inherent in the known types of mobile handheld electronic devices, now present in the known art, there is a need for an improved operated battery pack that can convert solar energy into electrical energy, without altering the front view of all mobile devices. A further possibility for extending the operating time of a mobile energy user is to provide a triple photovoltaic energy supply. The energy supply is tripled by the plurality of the affixed layers of internal batteries, incident light, the internal volume of albedo light and incidence light generated from the flat light emitting diodes and reflective materials. This would replace, and or recharge the energy store non-stop which allows for a full battery charge at any given time. This battery pack can be configured to be used with-in the cavity of the mobile phone battery compartment as a replacement battery and as other new electronic device embodiments.

2. Description of the Prior Art

A wide variety of solar energy charging systems for cell phones and portable electronic devices have been developed in the past decades. Cell phones, smartphones, laptops and tablets are relatively wee-developed devices. However, there is always a continuing need to improve features of components and operation of devices in almost every filed including the energy charging system, called the battery.

Several patents that have been issued in the past few decades and are focused on numerous versions of solar energy charging systems for cell phones and handheld electronic devices, however, they differ from the present invention. The prior art is as follows:

Little, et al., U.S. Pat. No. 4,740,431A, Published, on Apr. 26, 1988, to Little patent an integrated solar cell and battery are described, together with a process of making the same. The integrated solar cell and battery are made by employing thin film deposition techniques on a substrate. Preferably first, a thin film solar cell is deposited on the substrate, as for example, by sputtering. This step is immediately followed by the deposition of a thin film battery either onto the previous deposited thin film solar cell, or onto the back side of the substrate. The deposition process lends itself to automated production. The process includes the thin film deposition of series-connected arrays forming different types of integrated solar cells and batteries, depending on their electrical connections so as to vary the respective current and voltage characteristics of the resultant integrated units.

Parrish, et al., U.S. Pat. No. 5,936,380A, Published on Aug. 10, 1999, to Parrish patent a system for prolonging the operational life of a battery-powered laptop or notebook computer. Solar cells are incorporated into the chassis or display screen of a notebook computer so that the solar cells can provide power to any component of the notebook computer and/or help with the charging, powering, and/or regulation of a battery used as a power source. In one embodiment, solar cells are mounted near the light source so that unused light energy from the light source can be captured.

Chenx, et al., U.S. Pat. No. 2002/0088486, Published on Jul. 11, 2002, to Chenx, a patent a solar-powered device that is adapted to be disposed on a battery unit of a mobile telephone handset so as to charge the battery unit. The solar-powered device includes a light sensor, a photoelectric converting circuit coupled operably to the light sensor so as to convert light that is sensed by the light sensor into a corresponding current signal, and a current processing circuit, coupled electrically to the photoelectric converting circuit, for receiving and processing the current signal so as to result in a charging current that is adapted to charge the battery unit of the mobile telephone handset.

Po-Jung (John) Hsu, et al., U.S. Pat. No. 6,977,479 B2, Published on Dec. 20, 2005, to Po-Jung (John) patent a portable cellular phone battery charger using solar energy as the primary source of power and including two separate solar panels and a battery/switch containing unit. The two panels are hingedly connected together, and the battery/switch containing unit is hingedly connected to the back side of one of the panels. The assembly is pivotable between a retracted configuration in which the three component parts lie in parallel planes, and a deployed configuration in which the two solar panel lie in one plane and the battery/switch unit lies in another plane angularly intersecting the solar panel plane.

Shaff, et al., U.S. Pat. No. 2005/0282591, Published on Dec. 22, 2005, to Shaff patent a mobile telephone apparatus in which a solar power source is used to supplement battery power. A solar cell array is positioned on the surface of the telephone and supplies electric current to the telephone. A preferred embodiment of the present invention is equipped with speech recognition software that allows the user to issue commands (such as dialing the telephone) verbally to the telephone. In addition, this speech recognition mat be used to operate an integrate AM/FM broadcast radio to allow the telephone to double as a radio. In an alternative embodiment, the solar mobile telephone is integrated into a headset to allow for convenient hands-free operation.

Chen, et al., U.S. Pat. No. 2006/0238163, Published on Oct. 26, 2006, to Chen, patent a mobile phone which includes a main body. The main body further includes a solar power module, a display module, and an input module (i.e., a keypad). The solar power module is adapted for providing electrical power to the mobile phone. The solar power module includes a solar cell panel configured for converting light energy to electrical power. The Input module includes a control switch for setting the solar power module in one of the following states: "on", "off", or storage. Advantageously, the mobile phone can also be supplied with at least one heating pad disposed on the surface thereof, selectively controlled (e.g., on/off and/or a temperature chosen), to provide heat to a hand and/or other body part of a user.

Lin et al., U.S. Pat. No. 2008/0143291, Published on Jun. 19, 2008, to Lin, patent a communication apparatus with a solar energy charging function that includes a host and a display panel movably and pivotally coupled to the host to define a foldable mobile phone, and a solar panel is coaxially and pivotally coupled to a shaft of the host, such that the solar panel can be folded and covered onto an upper surface if the display panel. If the battery power of the mobile phone is low, users can individually lift the solar panel open from the display panel to charge the battery that is electrically coupled to the mobile phone, so as to enhance the power capacity, using time limit and battery charging requirements of the communication apparatus.

U.S. Pat. No. 2008/012518, patent a cellular phone case includes a container having a box and a lid to close the opening of the box. A solar cell is provided on the lid to be exposed under the sun light. A circuit board is provided in the box and is electrically connected to the circuit board. A socket is provided on the box and is electrically connected to the circuit board to input electricity power into the battery or to output electricity power from the battery.

Chen, et al., U.S. Pat. No. 2009/0160396A1, Published on Jun. 25, 2009, to Chen patent a charging device that receives light from diverse sources includes at least a solar cell that receives light from diverse sources to generate a voltage source, a charging circuit module connected with the solar cell to boost the voltage of the voltage source, and a connector connected with the charging circuit module. Such a design enables the present invention to charge a mobile phone or rechargeable battery by receiving the light radiated from the indoor light kits or sunlight.

Zhang et al., U.S. Pat. No. 2010/0001681A1, Published on Jan. 7, 2010, to Zhang patent a Solar-powered device having a body for housing at least one energy storage module and at least one control module are disclosed. The body includes an opening formed by at least two recesses disposed about an upper surface of the body. At least one solar panel may be coupled to the upper surface of the body where the solar panel may be received by the recesses.

Morichi et al., U.S. Pat. No. 2010/0167797, Published on Jul. 1, 2010, to Morichi patent a cellular phone according to the present invention comprises a plurality of solar cell modules, a mechanical form detection sensor as a state detection part for detecting a state of said cellular phone, and an electrical power selection part.

Gibson, et al., U.S. Pat. No. 2010/0231162A1, Published on Sep. 16, 2010, to Gibson, patent an Exemplary embodiments include methods and devices for storing and recovering renewable solar (photovoltaic) energy in batteries by using circuits that automatically connect batteries in parallel during charging and in series when discharging and to build battery strings that automatically resist overcharging and excessive discharging. Other embodiments may include methods for optimizing the efficiency of solar charging by varying the number of battery cells in series to match the battery voltage to the photovoltaic maximum power point voltage.

Blau, Bullen, et al., U.S. Pat. No. 8,531,152B2, Published on Sep. 10, 2013, to Blau, Bullen patent a personal solar appliance (PSA) is presented that collects and stores solar energy, A method of charging a battery from a solar cell according to some embodiments is presented that includes applying power from a bootstrap circuit when the battery has a very low state of charge or the solar cell has output below a threshold, and applying power from a maximum power point circuit when the battery and the solar cell provide power above the threshold.

U.S. Pat. No. 2014/0253038, battery recharging apparatus for smart phones and other mobile devices eliminates the need to carry a separate charger and/or cord. A cradle receiving the portable electronic device includes a plug into a wall outlet supplying AC line voltage. A power supply in the case converts the AC line voltage into low DC voltage, and a connector, configured to mate with the power input connector, provides the low DC voltage to the portable electronic device.

The plug may include pivoting prongs that folds into the case during periods of non-use. Alternatively, a plug may be provided with a retractable cord enabling a user to extend the cord and plug for charging purposes and retract the cord and plug into the case during periods of non-use. The case may further include an auxiliary rechargeable battery.

U.S. Pat. No. 2015/0256026, a solar powered case for charging electronic devices is provided. The solar powered case includes a housing having a body, a back panel and a front panel. The back panel and the front panel includes apertures that define interactive members of an electronic device. Solar panels are incorporated into the body of the housing. A circuit board is incorporated into the body of the housing and is integrally attached to the solar panel. An output jack extending from the circuit board is removable attached to the electronic device. A meter Light is disposed on the surface of the housing. The Meter Light indicates the strength of a light source used to power the solar panels.

Ricot, et al., U.S. Pat. No. 20160141898 A1, Published on May 19, 2016, to Ricot patent a cell phone charger built into the back of the phone or the back of the cell phone case for easy access and use without opening up the phone to charge the battery.

U.S. Pat. No. 5,522,943, a portable power supply that includes at least one solar panel assemble that is capable of producing an electrical output through the conversion of solar energy to electrical energy. The power supply further includes power transmission means which is typically an electrical cable that will supply the power output of the solar panel to an electrical energy consuming device such as a portable computer or a battery for use therewith. The portable power supply further includes a case having at least two opposing side panels and includes solar panel assembly attachment means permitting the mounting of a solar panel assembly. The solar panel assembly typically comprises a photovoltaic panel within the folded sections of the backing panel.

SUMMARY OF THE INVENTION

It is an object of the present known art of this invention to provide a mobile electrical energy user that has the ability to be integrated within an electrical energy user. Which has an improved energy supply and avoids the aforementioned disadvantages. In a preferred embodiment, the improved solar ultra-light operated battery has a triple light source to enhance an extra boost of solar energy. In addition, a non-solar rechargeable battery is another power source and is affixed to the plurality of layers in the internal volume known as the solar ultra-light operated battery pack. The solar powerful battery pack will include an upper and lower housing whereas the upper housing will be partially transparent for the silicon wafer assembly, an internal volume which includes sets of bi-facial solar panels, flat light emitting diodes housed on substrate of reflective lumen or similar materials, a circuit board, negative and positive wiring, voltage regulator and (zener diodes), other electrical components and a non-solar rechargeable battery, all electrically interconnected together. Disposed upon the outer housing are contacts/terminals/connector configured to the preferred embodiment in question. The pedestal arrangement design with stackable batteries and the internal/external light source will accelerate extend an almost unlimited battery charge without the need of sun light, USB cords, electrical outlets and the need for an extra charging unit. The solar ultra-light operated battery pack can be used in multiple embodiments but not limited too; built-in all new assorted handheld devices especially the mobile phones, including the desk top cordless phones, laptops and tablets.

Uniquely this battery can also be built into all handheld wireless operated tools. Moreover, the battery can be utilized on a vast production of aftermarket replacement batteries for all cell and smartphones.

Furthermore, the powerful battery pack can be used as a separate charging solar battery for certain geographical areas where's there's no electricity or good sunlight. Due to the present art's internal volume of an artificial light source, there's no need for sun light to generate electricity for the energy supply. For the additional energy supply of the energy user, at least two sets of bifacial solar panels that is fabricated of a thin-film cell. These thin-film cells are a new technology of tiny solar cells that are flexible, cheaper and stronger has been created that could mark a major breakthrough. The main difference between this solar cell and those in existing solar panels are their size—the new solar cell is approximately 1,000 times thinner. The thin-film cell consists of layers of silver and gold between the semiconductor layers, but the combined thickness is still only a few hundred nanometers thick, compared to a piece of paper which is 100,000 nanometers thick. The cell also overcomes some of the major problems with current solar tech like wear out or damage from high heat that comes from the absorption of great amounts of ultraviolet and infrared radiation that can't actually be turned into electricity due to a narrow band gap (the wave length) of light that can effectively be used to generate electricity. The additional of the silver and gold layers widen that bandgap meaning that the new solar cells can absorb and convert more of that UV and infrared radiation into electricity, which not only makes the technology more efficient, but also makes it much stronger and resilient. The solar cells can also be tuned to reflect the excess radiation if needed. The geometric of the solar cells, allows them to absorb the same rate of sunlight at any angle, which means that they don't need sophisticated sun tracking systems to generate the maximum amount of energy, the solar tracking is optional. Low-cost, compact, flexible and efficient solar cells are destined to impact all sorts of applications, as lightweight solar panels will eventually power all kinds of devices, particularly, in remote, inaccessible areas. The new solar panel technology will be used in the present known art or similar technology.

BRIEF DESCRIPTION OF CHARTS, TABLES, EXAMPLES AND DRAWINGS

Any accompanying charts, tables, examples and drawings which are incorporated in and constitute a part of this specification, illustrate examples of preferred embodiments of the invention and, along with the description, serve to explain the principles of the invention.

FIG. 1: Shows an exploded view of the upper and lower housing of a mobile phone, an internal view of the mobile battery pack electrical components that includes the non-solar rechargeable battery, flat light emitting diodes housed on aluminum reflective materials and circuit board, and bifacial solar rechargeable batteries in pedestal arrangement all internally electrically interconnected.

Figure 2:
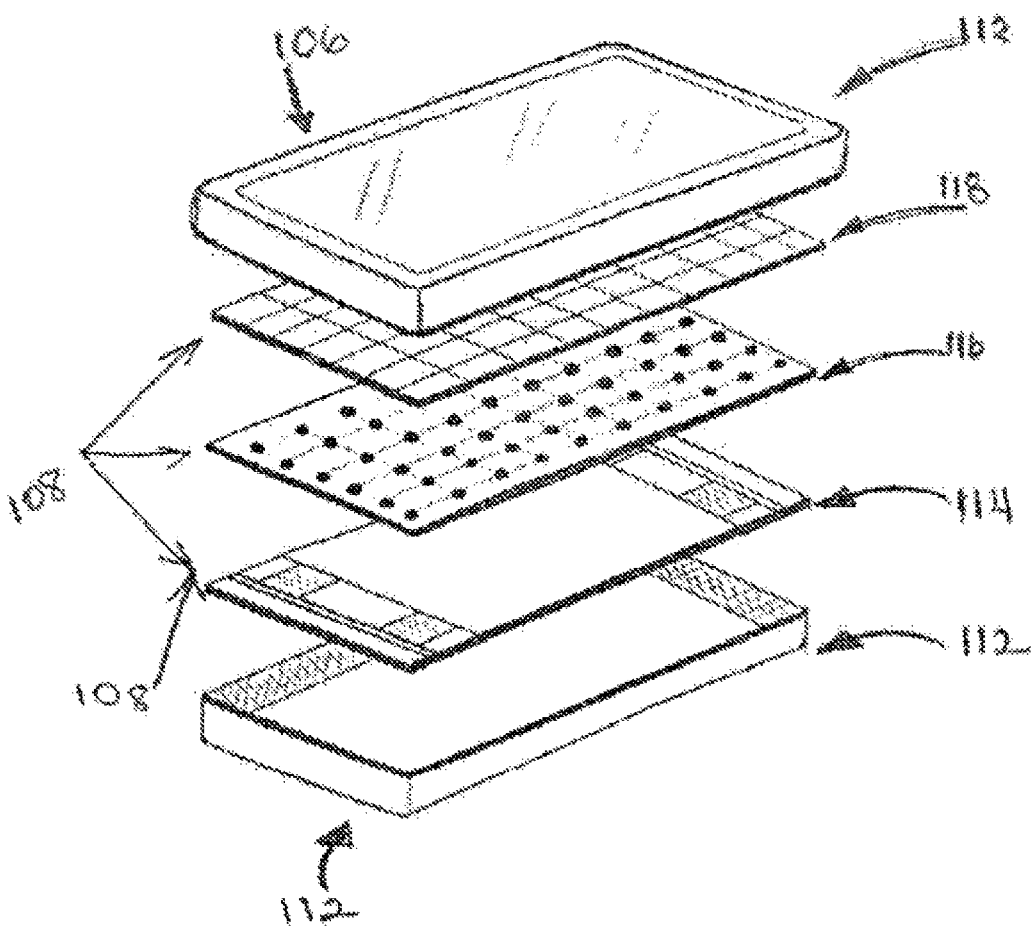

FIG. 2: Shows a schematic internal view of the mobile battery pack with lesser layers for electronic devices.

FIG. 3: Shows an exploded view of the smartphone battery with front and back battery casing for various cell and smartphones.

Figure 4:
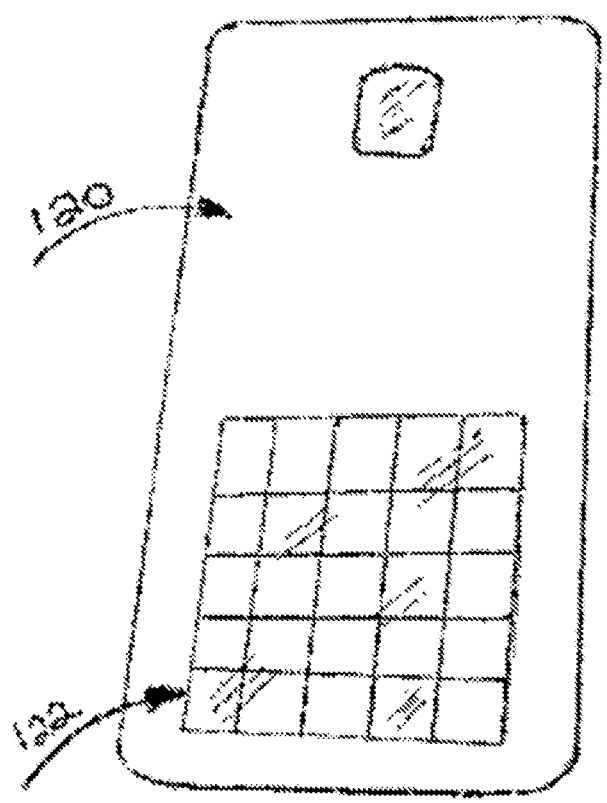

FIG. 4: Shows aftermarket smartphone back cover partially transparent for the silicon wafer assembly to allow a light source.

Figure 5:
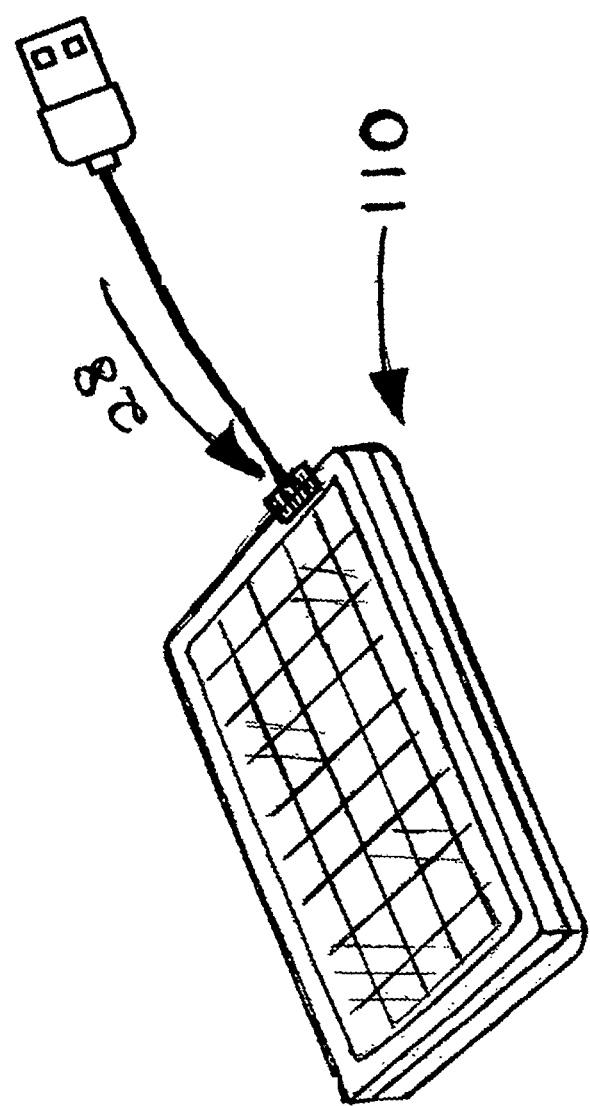

FIG. 5: Shows the battery pack as one unit configured as a stand-alone unit to connect to various electronic devices, or configured as a replacement battery for various mobile phones or as an integrated version for new electronic devices.

Figure 6:
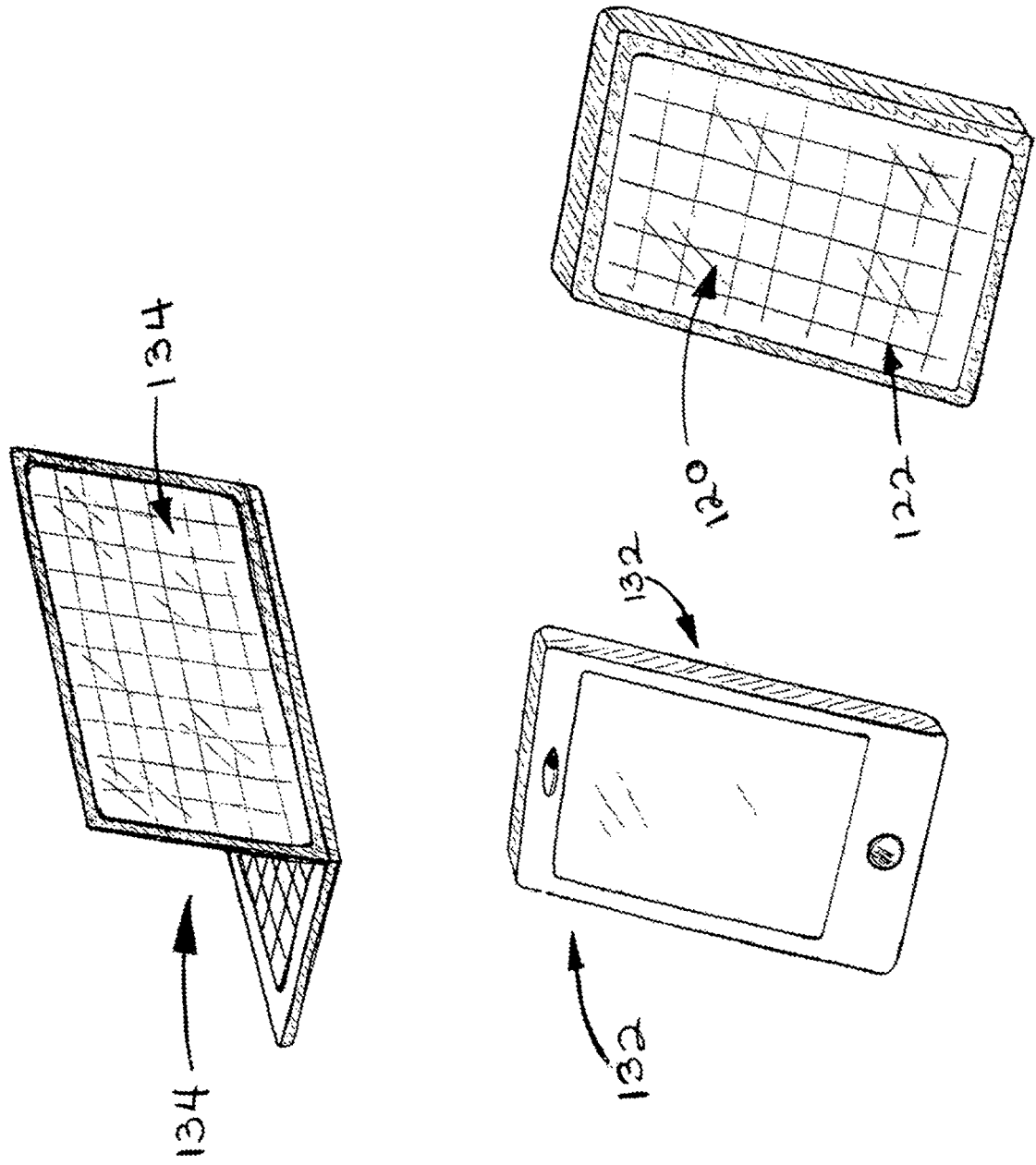

FIG. 6: Shows the solar battery pack integrated as a built in unit and applied to laptops, smartphones, and tablets.

Figure 7:
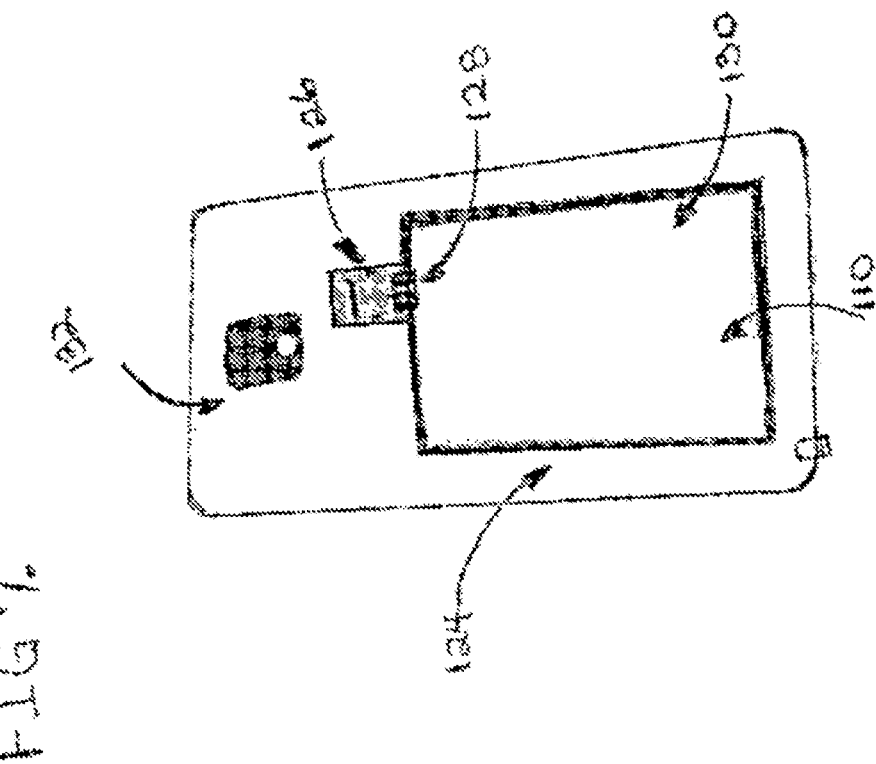

FIG. 7: Shows aftermarket version of the battery pack in the cavity of a smartphone battery compartment housing as a replacement battery.

The foregoing descriptions of specific embodiments of the present invention have been presented for purposes of illustration and description. They are not intended to be exhaustive or compartment housing as a replacement battery.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The exemplary embodiment was chosen and described in order to best explain the principles of the present invention and its practical application, to thereby enable others skilled in the art to best utilize the present invention and various embodiments with various modifications as are suited to the particular use contemplated.

DETAILED DESCRIPTION OF THE PREFERRED EMBODIMENT

Preferred embodiments of the present invention are illustrated in any charts, tables, examples and drawings that are included.

Referring now to FIGS. 1 and 2, there is shown an exploded view of an embodiment of the mobile battery pack. The mobile battery pack comprises a housing 112 with an internal volume. The internal volume comprising an upper surface 112 and a lower surface. In some embodiments, the upper surface 112 is removable-securable to the housing. The upper surface 112 comprises a transparent section configured to allow solar energy 106 to enter the interior volume. In some embodiments, the upper surface 110 comprises an opening to accomplish the same. A plurality of layers is disposed within the internal volume. The plurality of layers comprising a layer of bifacial solar panel 118 affixed to the upper surface. The plurality of layers further comprising a layer of flat light emitting diodes 116 on a substrate of reflective aluminum or similar materials, energized by a circuit board and immediately following the layer of 118 bifacial solar panel. The plurality of layers further comprising at least one set of layers comprising: a layer of at least one bifacial solar panel 118 in pedestal arrangement and a reflective layer of flat light emitting diodes 116 on a substrate of reflective aluminum or similar materials. The plurality of layers further comprising a layer of non-solar rechargeable battery 114 affixed to the lower surface. In one embodiment the layers are operably interconnected to one another 108 negative and positive electrical wiring components and to the internal negative and positive charging 128 contacts for integrated and 110, 130 replacement batteries. The charging contacts 128 are configured upon the housing 112 of the mobile battery pack 110 to connect within the housing cavity of mobile phone battery compartment 132 contacts 126 and other electronic devices 122, 134. The housing 120 for the back cover of the battery compartment of smartphones is 122 partially transparent.

In another embodiments the connector 128 is disposed upon the housing 112 for stand alone mobile battery packs 110. The connector 128 is designed to connect to an electronic device 134. The connector 128 upon the housing 112, houses the USB interface.

The plurality of layers are configured to receive energy 106 via the bifacial solar panels 118, the energy received from solar energy 106 or another light source, such as the 116 flat light emitting diodes, wherein the energy received is stored by the 114 non solar rechargeable battery. The diodes mechanism 108 will allow the bifacial solar panels 118 to supply electrical power to the rechargeable battery 114. A voltage regulator—is operably 108 interconnected to the plurality of layers, wherein the voltage regulator 108 is configured to limit the energy transmitted to minimize the risk of overheating or overcharging the 114 non-solar rechargeable battery. In the present art, the number of internal layers for the rechargeable batteries and flat light emitting diodes could vary depending on the total Watts (volts, mA's) 108 needed to power the electronic device.

Referring now to FIGS. 3 and 4, in a further embodiment of the invention the mobile energy user, and particularly the cell and smartphones 122, 132 market for extended life for 110, 130 aftermarket batteries. Most cell phone batteries are Lithium-polymer or Lithium-ion. These cell phone batteries are high in cost and quick to drain their charge due to the extensive heat from radiation. The need for an unlimited life replacement battery that has all day power, low in heat and less in cost is a necessity.

The present art of the solar ultra-light operated battery can be used as a replacement battery 110, 130 for various sizes and shapes to accommodate all mobile phones with removable batteries. Exact size, measurement, construction, and design specifications may vary upon manufacturing. All replacement batteries 110, 130 will use various custom mobile phone back cover 120 casing. These covers will be partially transparent 120, 122 to allow the upper layer of the solar battery pack to receive natural light.

Referring now to FIGS. 5 and 6, moreover, another embodiment of the present invention, the mobile energy user, the solar ultra-light operated battery pack 110, 130 can be used as a portable battery charger that contains the plurality of layers with a connector 128 upon the battery pack housing 112 for attaching an electronic device. Uniquely, another embodiment of the present art of this invention, the mobile energy user, the solar ultra-light operated battery pack 110, 130 can be used as a battery pack for wireless handheld tools. Within the housing 110, 112, 128 also includes a connector for attaching the solar battery pack. In the illustrated embodiment, the mobile battery pack 110 is shown as a stand-alone electronic device. The connector 128 is designed to connect to an electronic device 134. The connector 128 upon the housing 112, houses the USB interface. In some embodiments, the mobile battery pack 110, 130 is integrated into a second housing configured to receive a mobile electronic device 122, 132, 134 such as a cellular phone, tablet, laptop, etc. In other embodiments, the mobile battery pack is connected 110 to a base configured 128 to receive 122, 132, 134 mobile electronic devices.

Referring now to FIG. 7, in yet other embodiments, the mobile battery pack 110, 130 is integrated within the mobile phone housing 122 called battery compartment for new 122, 132 and old cell 110, 130 and smart phones. Whereas within the mobile phone battery housing 126 negative and positive contacts 128 connects to the solar battery 126,128 negative and positive contacts. The cavity 124 of the phone battery housing will configured to fit all new phones. The replacement batteries will be 110,130 configured to fit a variety of old mobile phones.

Referring now to FIGS. 1 and 2,3,4,5,6,7 there is shown multiple illustrative views of an embodiment of the 110,130 mobile battery pack. In the illustrated embodiment, the light emitting diodes 116 are planar and each solar panel 118 layer is bifacial. In one embodiment, the mobile battery pack 110 is configured to be received as a 110,130 replacement battery for a cellular phone 132 and an aftermarket smart phone 120 back cover for the battery compartment 124,132.

What is claimed:

1. A mobile battery pack, comprising:
a housing;
the housing comprising an upper surface and a lower surface;
the upper surface of the housing comprising a transparent portion;
a plurality of layers disposed between the upper surface and the lower surface;
the plurality of layers comprising at least one bifacial solar panel disposed in the housing, beneath the transparent portion;
the plurality of layers comprising at least one reflective layer disposed in the housing;
the reflective layer comprising at least one light emitting diode thereon;
the reflective layer in operable connection with the bifacial solar panel;
the reflective light emitting diode activates the solar array producing solar energy;
a rechargeable battery in operable connection with the bifacial solar panel;
and means for transmitting the solar energy to the rechargeable battery;
wherein a voltage regulator in operable connection with the rechargeable battery;
wherein the negative and positive battery charging contacts connected to the voltage regulators and connected to the rechargeable battery;
a battery compartment in which the negative and positive battery charging contacts are positioned;

and means for transmitting electrical energy to the voltage regulators and means for transmitting electrical energy connecting the voltage regulators to the negative and positive battery charging contact;

wherein a mobile battery pack is inserted internally within the mobile phone battery compartment and upon contact the rechargeable battery power supply provides power to the mobile device.

2. The mobile battery pack of claim 1, further comprising a connector, the connector configured to attach the mobile battery pack to a mobile device.

3. The mobile battery pack of claim 2, wherein the connector is a USB connector.

4. The mobile battery pack of claim 2, wherein the connector connects to a device selected from the group consisting of a laptop, tablet, play station, desk top computer, smart phone, hand-held power tool, printer and hand-held electronic devices.

5. A mobile phone battery pack of claim 1, comprising a cover in operative connection with the upper portion of the housing and wherein the cover is removable from the lower portion of the housing.

\* \* \* \* \*